US008866941B2

(12) United States Patent
Abe et al.

(10) Patent No.: US 8,866,941 B2
(45) Date of Patent: Oct. 21, 2014

(54) SOLID STATE IMAGING DEVICE WITH WIRING LINES SHIFTED FOR PUPIL CORRECTION AND SIMPLIFIED WIRING PATTERN AND METHOD OF MANUFACTURING THE SAME

(75) Inventors: Takashi Abe, Kanagawa (JP); Ryoji Suzuki, Kanagawa (JP); Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 270 days.

(21) Appl. No.: 13/104,604

(22) Filed: May 10, 2011

(65) Prior Publication Data

US 2011/0285901 A1 Nov. 24, 2011

Related U.S. Application Data (63) Continuation of application No. 11/788,925, filed on Apr. 23, 2007, now Pat. No. 7,940,328.

(30) Foreign Application Priority Data

May 25, 2006 (JP) ................... 2006-145603

(51) Int. Cl.
*H04N 9/64* (2006.01)
*H01L 27/146* (2006.01)
(52) U.S. Cl.
CPC .... *H01L 27/14603* (2013.01); *H01L 27/14636* (2013.01)
USPC ........................................................ 348/251

(58) Field of Classification Search
CPC ........ H04N 9/045; H04N 5/335; H04N 5/378
USPC ........... 348/374, 373, 335, 340, 76, 241, 251; 439/67, 68, 69, 70, 71, 72, 77; 250/208.1
See application file for complete search history.

(56) References Cited

U.S. PATENT DOCUMENTS

| 7,214,920 B2* | 5/2007 | Gazeley ..................... 250/208.1 |
| 7,408,140 B2* | 8/2008 | Gazeley ..................... 250/208.1 |
| 7,432,491 B2* | 10/2008 | Silsby et al. ............... 250/208.1 |
| 2003/0011831 A1* | 1/2003 | Sakurai et al. ............... 358/513 |
| 2006/0249653 A1* | 11/2006 | Gazeley ..................... 250/208.1 |
| 2006/0249654 A1* | 11/2006 | Silsby et al. ............... 250/208.1 |
| 2007/0205356 A1* | 9/2007 | Gazeley ..................... 250/208.1 |
| 2009/0057537 A1* | 3/2009 | Silsby et al. ............... 250/208.1 |

* cited by examiner

*Primary Examiner* — Nicholas Giles
(74) *Attorney, Agent, or Firm* — Rader, Fishman & Grauer PLLC (57) ABSTRACT

A solid-state imaging device is provided. The solid-state imaging device includes an imaging area that includes arrayed pixels having photoelectric converting units and transistor elements; and a peripheral circuit, in which a wiring line in the imaging area that is shifted based on pupil correction amount and a wiring line in the peripheral circuit that is not shifted are connected through a connection expanded portion integrally formed with one or both of the wiring lines.

12 Claims, 10 Drawing Sheets

SOLID STATE IMAGING DEVICE WITH WIRING LINES SHIFTED FOR PUPIL CORRECTION AND SIMPLIFIED WIRING PATTERN AND METHOD OF MANUFACTURING THE SAME

CROSS REFERENCES TO RELATED APPLICATIONS

The present invention contains subject matter related to Japanese Patent Application JP 2006-145603 filed in the Japanese Patent Office on May 25, 2006, the entire contents of which being incorporated herein by reference.

BACKGROUND OF THE INVENTION

1. Field of the Invention

The present invention relates to a solid-state imaging device and a method of manufacturing the same, and particularly to a solid-state imaging device including within a pixel a unit for converting electric charge generated by a photoelectric converting unit into a pixel signal, for example, a CMOS (complementary metal-oxide semiconductor) image sensor and a method of manufacturing the same. The CMOS image sensor is herein described as an image sensor formed by either applying a CMOS process or partly using the CMOS process. Further, the present invention relates to a camera module incorporating the solid-state imaging device.

2. Description of the Related Art

The CMOS image sensor is a solid-state imaging device including a plurality of pixels formed of a photoelectric converting element and a plurality of MOS (metal-oxide semiconductor) transistors, the pixels being arranged in the form of a two-dimensional array, in which electric charge generated by the photoelectric converting element is converted into a pixel signal and read. In recent years, such CMOS image sensor has been a focus of constant attention as an imaging element used for electronic equipment such as a built-in camera for a mobile phone unit, a digital still camera and a digital video camera.

Figure 1:
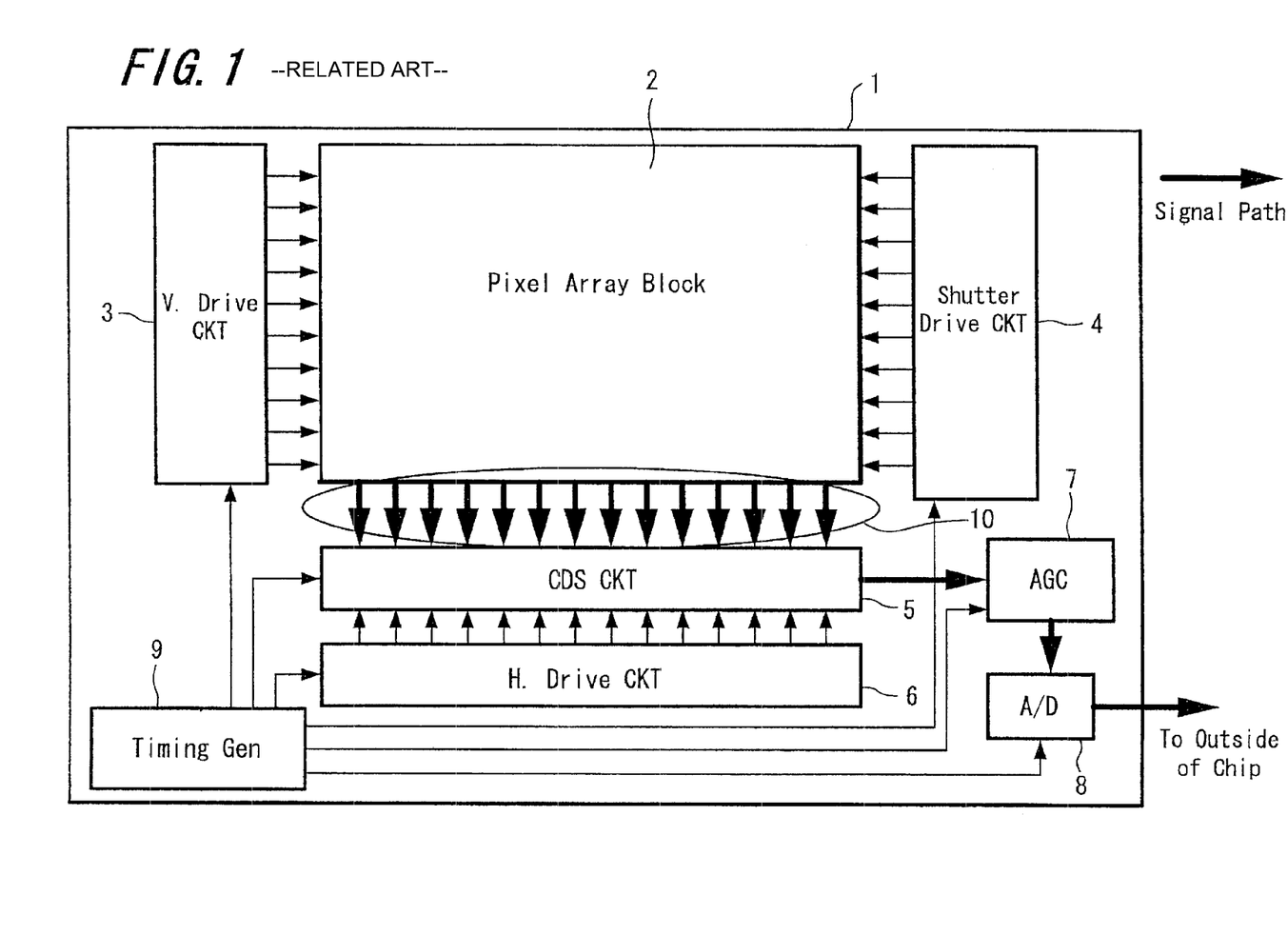
FIG. 1 is a block diagram showing an example of a CMOS image sensor.

FIG. 1 shows a schematic arrangement of a typical CMOS image sensor (image sensor chip). As shown in FIG. 1, a CMOS image sensor 1 includes in a semiconductor substrate (semiconductor chip) a pixel array block (imaging area) 2, and as a peripheral circuit portion, a vertical driving circuit 3, a shutter driving circuit 4, a CDS (correlated double sampling) circuit 5, a horizontal driving circuit 6, an AGC (automatic gain control) circuit 7, an A/D (analog-to-digital) converter (A/D converting circuit) 8, a timing generator 9 and the like.

As shown in FIG. 1, the pixel array block 2 includes a plurality of pixels in the form of two-dimensional arrays, each pixel including one or a plurality of photoelectric converting elements and MOS (metal-oxide semiconductor) transistors; output signal lines from respective pixels; and a plurality of signal lines to drive respective pixels. The vertical driving circuit 3 supplies to the pixel array a signal to select a read row of pixels. The shutter driving circuit 4 is provided to select a row similarly to the vertical driving circuit 3 and can adjust time (storage time) for exposing the photoelectric converting element by adjusting a time interval with the vertical driving circuit 3.

A signal read from the row selected by the vertical driving circuit 3 is input to the CDS circuit 5 provided for each column or a plurality of columns. The CDS circuit 5 receives a reset level and a signal level from each pixel and cancels a fixed pattern noise of each pixel by calculating a difference between the reset level and the signal level. The horizontal driving circuit 6 sequentially selects signals on which CDS processing is performed and which are retained in respective columns. A signal of the selected column is supplied to the AGC circuit 7 at the subsequent stage, applied with a proper gain, converted into a digital signal by the A/D converter 8 and then output to the outside of the image sensor chip. Further, respective circuit blocks (the vertical driving circuit 3, the shutter driving circuit 4, the CDS circuit 5, the horizontal driving circuit 6, the AGC circuit, the A/D converter and the like) are driven by signals generated inside the timing generator 9.

The block arrangement illustrated in FIG. 1 shows an example of the CMOS image sensor. Other CMOS image sensors such as a CMOS image sensor not including an A/D converter inside the chip, a CMOS image sensor including A/D converters in respective columns, a CMOS image sensor including a single CDS circuit, a CMOS image sensor including a number of output systems such as a CDS circuit, an AGC circuit and the like may also be used. Signals are read from the pixels to the CDS circuit 5 through the pixel output line 10 provided to each column.

Figure 2:
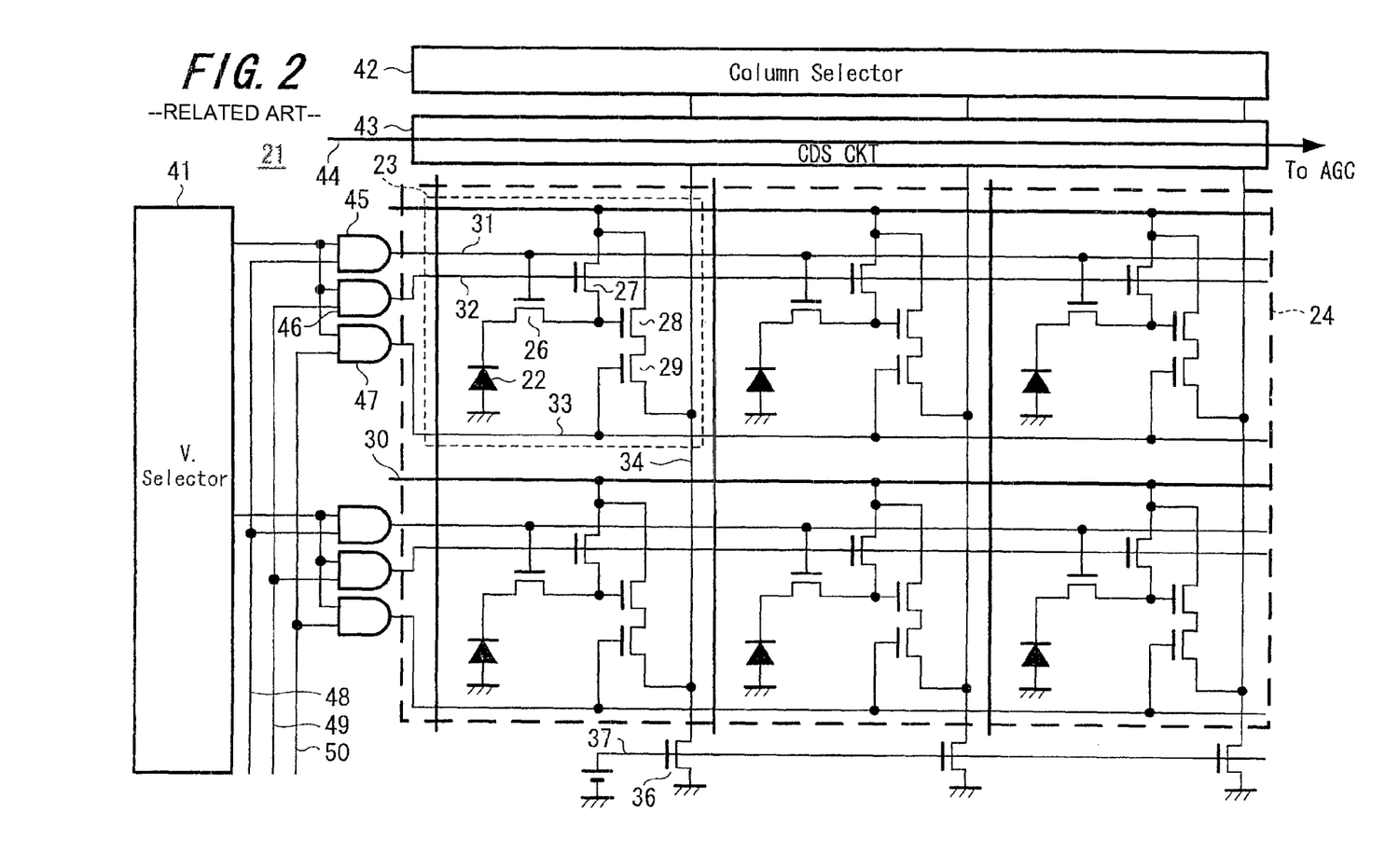
FIG. 2 is a diagram showing an example of pixels and peripheral circuit portions of a CMOS image sensor.

FIG. 2 shows an example of a pixel and peripheral circuit portion of the above-described CMOS image sensor. As shown in FIG. 2, a CMOS image sensor 21 includes a pixel array block (imaging area) 24 formed of a two-dimensional array of a plurality of pixels (unit cells) 23 each including one photoelectric converting element 22 made of a photo-diode, for example, and a plurality of MOS transistors and a peripheral circuit portion.

The photoelectric converting element 22 receives light and stores signal electric charges generated by photoelectric conversion. A plurality of MOS transistors are provided for each pixel and in this example there are four transistors, specifically, a transfer transistor 26, a reset transistor 27, an amplification transistor 28 and a selection transistor 29. The transfer transistor 26 transfers signal electric charges stored in the photoelectric converting element 22 to a floating diffusion (FD), in other words, the gate of the amplification transistor 28. The reset transistor 27 resets gate potential of the amplification transistor 28. The amplification transistor 28 amplifies signal electric charges. The selection transistor 29 selects the output pixel.

In the pixel 23, the source of the transfer transistor 26 is connected to the photoelectric converting element 22 and the drain thereof is connected to the source of the reset transistor 27. A transfer signal line 31 for the control of gate potential is connected to the gate of the transfer transistor 26. The drain of the reset transistor 27 is connected to a power source potential supply line 30 and the gate thereof is connected to a reset signal line 32 to control the gate potential. The drain of the amplification transistor 28 is connected to the power source potential supply line 30, the source thereof is connected to the drain of the selection transistor 29 and the gate thereof is connected to the floating diffusion (FD) between the transfer transistor 26 and the reset transistor 27. The source of the selection transistor 29 is connected to the pixel output line 34 and the gate thereof is connected to the selection signal line 33 to control the gate potential.

A transistor 36 to supply a constant electric current is connected to the pixel output line 34, and supplies a constant electric current to the selected amplification transistor 28, causing the amplification transistor 28 to operate as a source-follower transistor and to output to the pixel output line 34 a gate potential of the amplification transistor 28 and a potential having a constant voltage difference from the potential of the amplification transistor 28. A constant electric potential supply line 37 for supplying a constant electric potential is connected to the gate of the transistor 36, allowing the transistor 36 to perform a saturation region operation of supplying a constant electric current.

On the other hand, a vertical selector 41, a column selector 42 and a CDS (correlated double sampling) circuit 43 are located as peripheral circuits. Further, a row selection AND element 45, output end of which is connected to the transfer signal line 31; a row selection AND element 46, output end of which is connected to the reset signal line 32; and a row selection AND element 47, output end of which is connected to the selection signal line 33, are provided to each row of the pixels 23.

One input end of the row selection AND element 45 of each row is connected to a pulse terminal 48 configured to supply a transfer pulse to the transfer signal line 31, and the other input end thereof is connected to an output from the vertical selector 41. One input end of the row selection AND element 46 of each row is connected to a pulse terminal 49 configured to supply a reset pulse to the reset signal line 32, and the other input end thereof is connected to an output from the vertical selector 41. One input end of the row selection AND element 47 of each row is connected to a pulse terminal 50 configured to supply a selection pulse to the selection signal line 33, and the other input end thereof is connected to an output from the vertical selector 41.

According to the above-mentioned arrangement, each control pulse is supplied only to the signal line selected by the vertical selector 41. An operation of reading from each pixel 23 is carried out as follows together with drive signals shown in FIG. 3.

Figure 3:
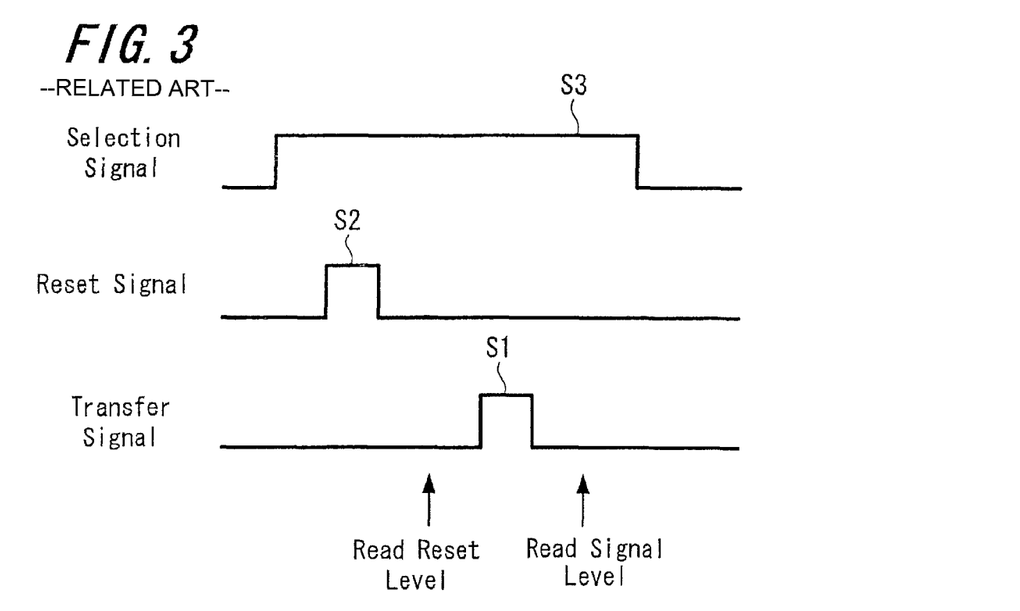
FIG. 3 is a diagram of waveforms of drive signals for use with the CMOS image sensor shown in FIG. 2.

As shown in FIG. 3, a transfer signal (pulse) S1 is supplied to the transfer signal line 31, a reset signal (pulse) S2 is supplied to the reset signal line 32 and a selection signal (pulse) S3 is supplied to the selection signal line 33.

First, the selection pulse S3 and the reset pulse S2 are supplied. The selection transistor 29 of the row to be read and the reset transistor 27 are ON, and electric potential of the gate (floating diffusion FD) of the amplification transistor 28 is reset. After the reset transistor 27 is OFF, a voltage corresponding to reset level of each pixel 23 is read to the CDS circuit 43 at the subsequent stage. Next, the transfer pulse S1 is supplied, and the transfer transistor 26 is ON to transfer electric charges stored in the photoelectric converting element 22 to the floating diffusion (FD), in other words, the gate of the amplification transistor 28. After the transfer of the electric charges, the transfer transistor 26 is OFF and a voltage of a signal level corresponding to the amount of stored electric charges is read to the CDS circuit 43 at the subsequent stage.

The CDS circuit 43 calculates a difference between the previously read reset level and the signal level and cancels a fixed pattern noise due to variations of a threshold voltage Vth of the amplification transistor 28 for each pixel. When the signal stored in the CDS circuit 43 is selected by the column selector 42, the selected signal is read through a horizontal signal line 44 to circuits at the subsequent stages such as an AGC (automatic gain control) circuit to be processed.

Figure 4:
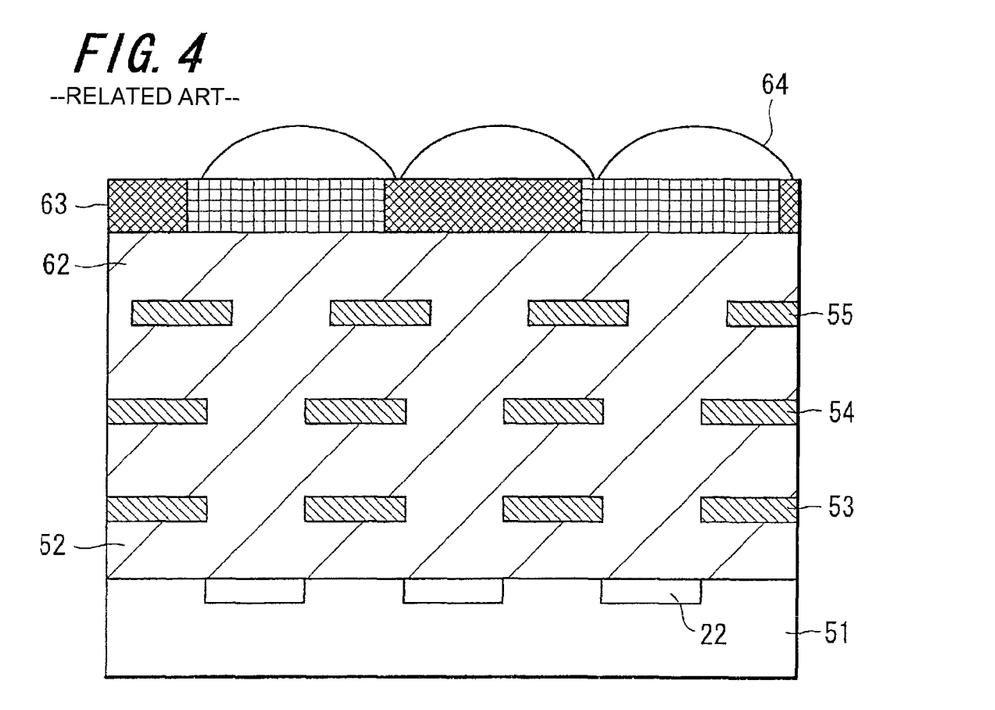
FIG. 4 is a cross-sectional view showing a cross-sectional structure of the imaging area according to the related art.

FIG. 4 is a diagram showing a schematic cross-sectional structure of the pixel array block 2 shown in FIG. 1. In the pixel array portion, a plurality of photoelectric converting elements 22 corresponding to respective pixels is formed on a semiconductor substrate 51. While FIG. 4 shows only the photoelectric converting elements 22, the other MOS transistors 26, 27, 28 and 29 described above are formed on respective pixels. A plurality of wiring layers, in this example, three wiring layers 53, 54 and 55 are formed above the semiconductor substrate 51 through an insulating interlayer 52. These wiring layers correspond to the vertical signal line 34, the reset signal line 32, the transfer signal line 31, the selection signal line 33, the power supply line 30 and connecting electrodes (connecting respective signal lines and MOS transistors) provided independently of those lines 30 to 34.

Figure 5:
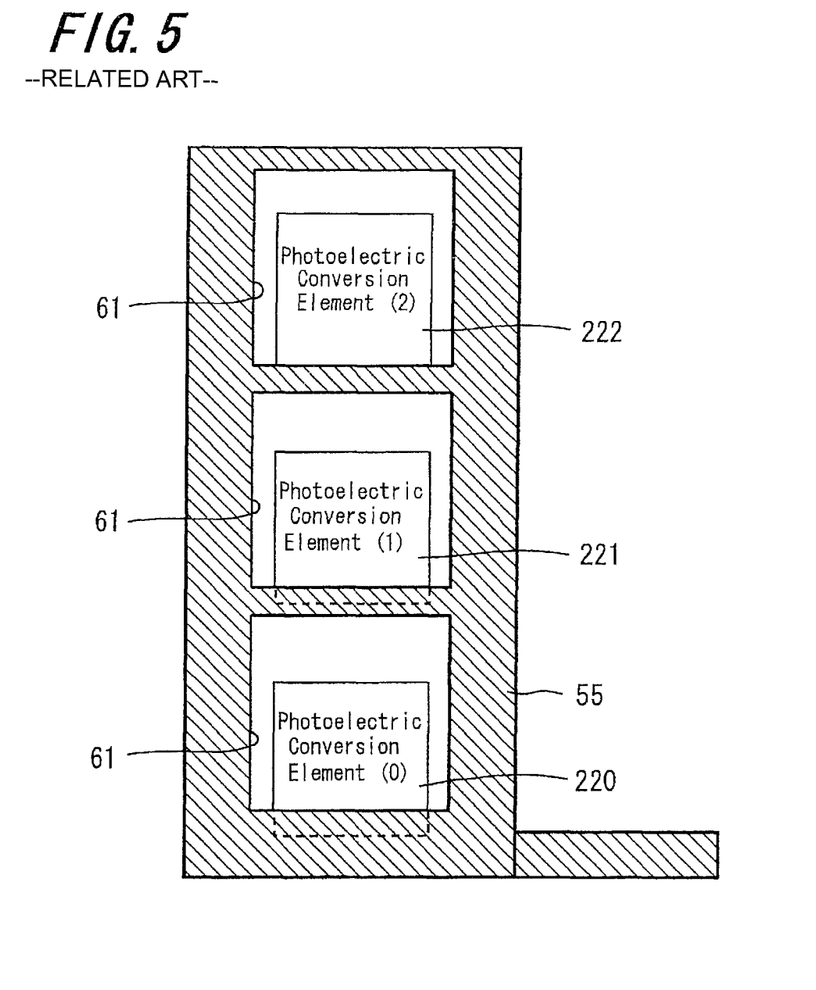
FIG. 5 is a plan view showing an example in which wiring lines on whole surface wiring are shifted in the imaging area.

Here, the signal lines (34, 32, 31, 33 and connecting electrodes) in the horizontal and vertical directions are arranged so as to form an opening portion around the photoelectric converting element 22. The power source wiring line 30 corresponds to the third wiring layer 55 and is formed on the uppermost layer. As shown in FIG. 5, the wiring layer 55 to be the power supply line 30 is formed to have openings 61 corresponding to the photoelectric converting elements 22 [220, 221, 222, . . . ]. These wiring layers 53 to 55 also can serve as light-shielding layers as well. A color filter 63 is formed on an insulating interlayer of the uppermost layer, that is, a planarized film 62, and an on-chip microlens 64 is formed on the color filter 63.

At present, solid-state imaging devices typically include the on-chip microlens in order to improve an optical focusing ratio as described above. However, in the peripheral portion where light is incident obliquely on the imaging area, the center of light focused by the on-chip microlens is shifted from the center of the photoelectric converting element. Therefore, the optical focusing ratio is lowered, thereby lowering sensitivity. Such decrease in sensitivity is larger in the peripheral portion of the imaging area as compared to the center thereof and causes "shading" as a result. Therefore, the on-chip microlens is shifted in order to control such shading.

Also, since the CMOS solid-state imaging device includes a plurality of wiring layers, incident light is shaded by the wiring layers to cause shading. Since a CCD (charge-coupled device) solid-state imaging device has a structure different from that of the CMOS solid-state imaging device, the incident light is not shaded by the wiring layers. Japanese Unexamined Patent Application Publication No. 2004-253568 and Japanese Unexamined Patent Application Publication No. 2003-273342 have proposed technologies of controlling shading by also shifting the wiring layers.

SUMMARY OF THE INVENTION

In the CMOS image sensor, it is necessary that the wiring layers should be shifted while electric connection is being maintained. Hence, in the case of the wiring on the whole surface such as the wiring layer 55 forming the power supply line shown in FIG. 5, the wiring layers can be shifted relatively easily. Wiring lines such as the above-described wiring layers 53 and 54 extended in the horizontal and vertical directions are connected to the peripheral circuit, and therefore may not be shifted. As a result, incident light may be shaded by the wiring layers 53 and 54 to cause the shading.

Figure 6:
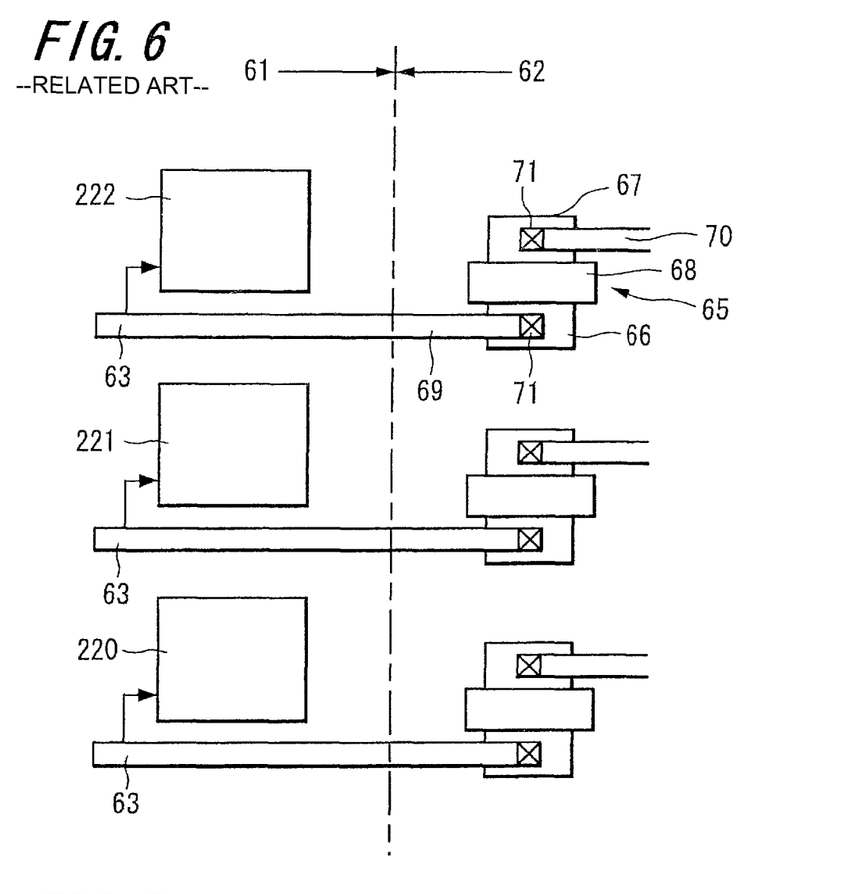
FIG. 6 is a plan view showing an example of connections of wiring lines in the imaging area and wiring lines in the peripheral circuit according to the related art.

Specifically, as shown in FIG. 6, wiring lines 63 (corresponding to the wiring layers 53 and 54) connected to the pixels including the respective photoelectric converting elements 22 [220, 221, 222] are formed in an imaging area 61; and vertical driving circuits, herein, MOS transistors 65 constituting a vertical driver are formed in a peripheral circuit 62. The MOS transistor 65 includes a pair of source/drain regions 66 and 67 and a gate electrode 68. Electrodes (wiring lines) 69 and 70 are connected to the respective source/drain regions 66 and 67. The MOS transistor 65 constituting the vertical driver is formed such that the positions of the electrodes 66, 67 and contact portions 71 may be fixed to predetermined positions. Accordingly, in order to connect the wiring line 63 in the imaging area 61 to the electrode 69 in one source/drain region 66, that is, in order to extend the wiring line 63 so as to be connected to the contact portion 71 as shown in FIG. 6, the wiring line 63 should be formed at a predetermined position and may not be shifted based on the pupil correction amount in the imaging area.

In other words, the positions of wiring lines in the peripheral circuit 62 are fixed. Therefore, if the above-described wiring layers 53 and 54 are shifted and formed to prevent oblique incident light from being shaded, the wiring layers 53 and 54 may not be connected to the wiring line 69 in the peripheral circuit 62. Hence, positions of the wiring layers 53 and 54 may not be shifted.

Figure 7:
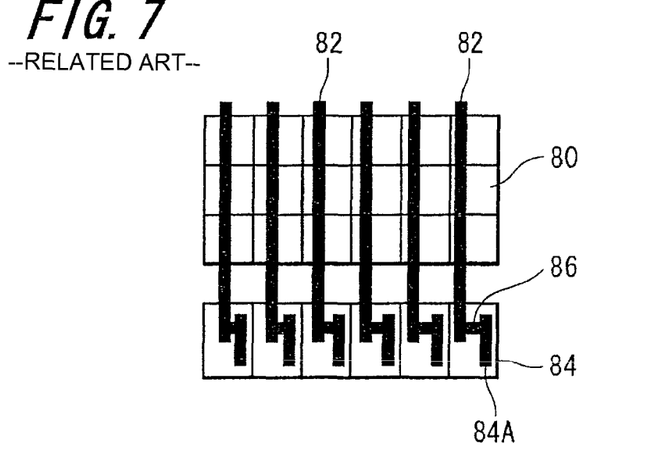
FIG. 7 is a plan view showing another example of connections of wiring lines in the imaging area and wiring lines in the peripheral circuit according to the related art.

On the other hand, Japanese Unexamined Patent Application Publication No. 2003-273342 (see FIG. 7 thereof) proposes a method in which a wiring line 84A within each peripheral circuit 84, and each signal line 82 in a pixel array 80 shifted based on a pupil correction amount are connected by a wiring element member 86 each provided in the peripheral circuit 84. Accordingly, in the case where the position of the signal line and the position of the peripheral circuit are not aligned, the line may be connected to the peripheral circuit. However, when a wiring pattern is formed such that the signal line 82 and the wiring line 84A in the peripheral circuit are integrated using the wiring element member 86, different layouts should be required for each wiring pattern based on the pupil correction amount so that design of a mask used for wiring layout becomes difficult.

It is desirable to provide a solid-state imaging device capable of controlling shading more efficiently by shifting wiring lines in the imaging area and in which design of a mask used for wiring layout may be easy and a method of manufacturing the same.

Also, it is desirable to provide a camera module including such solid-state imaging device.

According to an embodiment of the present invention, there is provided a solid-state imaging device including an imaging area that includes arrayed pixels having photoelectric converting units and transistor elements and a peripheral circuit, in which a wiring line in the imaging area that is shifted based on pupil correction amount and a wiring line in the peripheral circuit that is not shifted are connected through a connection expanded portion integrally formed with one or both of the wiring lines.

In the solid-state imaging device according to an embodiment of the present invention, since the connection expanded portion is formed on one or both of the shifted wiring line in the imaging area and the wiring line not shifted in the peripheral circuit, the wiring line in the imaging area can be shifted within the range of the connection expanded portion and the shifted wiring line and the wiring line in the peripheral circuit can be connected.

According to an embodiment of the present invention, there is provided a solid-state imaging device including an imaging area that includes arrayed pixels having photoelectric converting units and transistor elements and a peripheral circuit, in which a wiring line in the imaging area that is shifted based on pupil correction amount is connected through a connection expanded portion integrally formed with the wiring line to a contact area of an element in the peripheral circuit.

In the solid-state imaging device according to an embodiment of the present invention, since the connection expanded portion is integrally formed on the shifted wiring line, and the connection expanded portion and the contact area of the element in the peripheral circuit are connected within the range of the connection expanded portion, the wiring line in the imaging area can be shifted.

According to an embodiment of the present invention, there is provide a method of manufacturing a solid-state imaging device including an imaging area that includes arrayed pixels having photoelectric converting units and transistor elements and a peripheral circuit, in which a wiring line in the imaging area that is shifted based on pupil correction amount and a wiring line in the peripheral circuit that is not shifted are connected. The method includes the steps of: forming the wiring line in the imaging area and the wiring line in the peripheral circuit with different layers; and connecting both of the wiring lines through a connection expanded portion integrally formed with one or both of the wiring lines.

In the method of manufacturing the solid-state imaging device according to an embodiment of the present invention, since the wiring line in the imaging area and the wiring line in the peripheral circuit are connected through the connection expanded portion, the wiring line in the imaging area alone can be shifted without shifting the wiring line in the peripheral circuit.

According to an embodiment of the present invention, there is provided a method of manufacturing a solid-state imaging device including an imaging area that includes arrayed pixels including photoelectric converting units and transistor elements and a peripheral circuit, in which a wiring line in the imaging area that is shifted based on pupil correction amount and a wiring line in the peripheral circuit that is not shifted are connected. The method includes the step of forming the wiring line in the imaging area and the wiring line in the peripheral circuit connected through a connection expanded portion with single wiring layer.

In the method of manufacturing the solid-state imaging device according to an embodiment of the present invention, since the wiring line in the imaging area and the wiring line in the peripheral circuit are connected through the connection expanded portion, the wiring line in the imaging area alone can be shifted without shifting the wiring line in the peripheral circuit. Also, since the wiring lines of the peripheral circuit and those of the imaging area connected to each other are formed of the single wiring layer, the number of manufacturing processes can be reduced.

According to an embodiment of the present invention, there is provided a method of manufacturing a solid-state imaging device including an imaging area that includes arrayed pixels including photoelectric converting units and transistor elements and a peripheral circuit, in which a wiring line in the imaging area that is shifted based on pupil correction amount and an element in the peripheral circuit that is not shifted are connected. The method includes the steps of: forming the wiring line in the imaging area and a connection expanded portion at an extended end portion of the wiring line with a single wiring layer; and connecting the connection expanded portion and a contact area of the element.

In the solid-state imaging device according to an embodiment of the present invention, since the wiring lines in the imaging area and the connection expanded portions at the extended end portions are formed by the single wiring layer and the wiring lines in the imaging area and the contact area of the element in the peripheral circuit are connected through the connection expanded portions, the wiring lines in the imaging area alone can be shifted without shifting the contact area of the element in the peripheral circuit.

According to an embodiment of the present invention, there is provided a camera module including a solid-state imaging device and an optical lens system, in which the solid-state imaging device includes an imaging area that includes arrayed pixels having photoelectric converting units and transistor elements and a peripheral circuit. A wiring line in the imaging area that is shifted based on pupil correction amount and a wiring line in the peripheral circuit that is not shifted are connected through a connection expanded portion integrally formed with one or both of the wiring lines.

According to an embodiment of the present invention, there is provided a camera module including a solid-state imaging device and an optical lens system, in which the solid-state imaging device includes an imaging area that includes arrayed pixels having photoelectric converting units and transistor elements and a peripheral circuit. A wiring line in the imaging area that is shifted based on pupil correction amount is connected to a contact area of an element in the peripheral circuit through a connection expanded portion integrally formed with the wiring line.

In the solid-state imaging device according to the embodiments, since the wiring line in the imaging area alone can be shifted and formed without shifting the wiring line in the peripheral circuit or the contact area of the element, shading caused by multilayer wiring can be controlled more efficiently. Also, when a mask for wiring layout is designed, since the mask can be designed such that the pattern data on the wiring line integrated with the connection expanded portion is constant and that the connection position can be changed based on the pupil correction amount, the mask can be designed easily.

Further, in the method of manufacturing the solid-state imaging device according to the embodiments, since the wiring line in the imaging area alone can be shifted and formed without shifting the wiring line or the contact area of the element in the peripheral circuit, the solid-state imaging device in which shading caused by multilayer wiring is controlled more efficiently can be manufactured.

Furthermore, in the camera module according to the embodiments, since the camera module includes the above-described solid-state imaging device in which the shading is controlled, an image quality can be improved.

DESCRIPTION OF THE PREFERRED EMBODIMENTS

Embodiments of the present invention will be described below with reference to the drawings.

Figure 8:
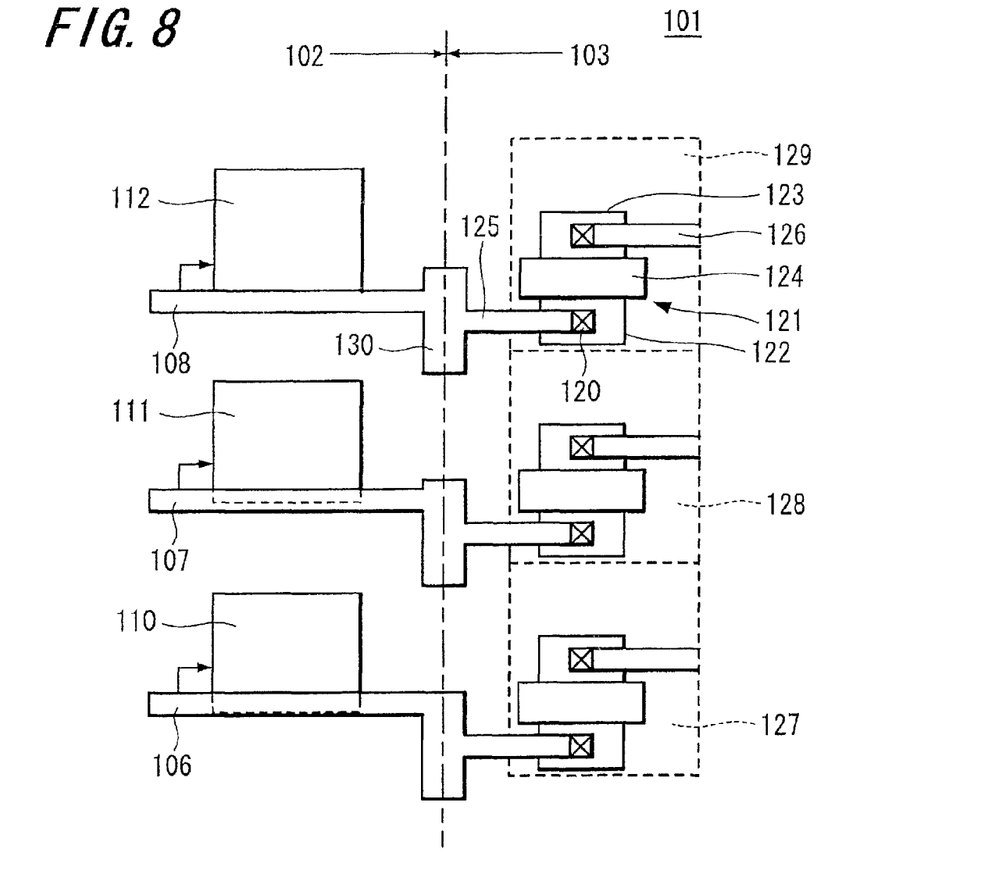
FIG. 8 is a schematic diagram of a main portion showing a solid-state imaging device according to a first embodiment of the present invention.

FIGS. 8 to 11 are diagrams showing a solid-state imaging device according to a first embodiment of the present invention. As shown in FIG. 8, a solid-state imaging device 101 includes an imaging area in which a plurality of unit cells formed of photoelectric converting elements and a plurality of MOS transistors for reading signals from the photoelectric converting elements are arranged in a two-dimensional array, and a peripheral circuit. A unit cell may be one pixel formed of one photoelectric converting element and a plurality of MOS transistors, or may be formed of a plurality of pixels including a plurality of MOS transistors shared by a plurality of photoelectric converting elements.

The aforementioned CMOS image sensor shown in FIGS. 1 and 2, for example, or the CMOS image sensor part of which is changed can be applied to the solid-state imaging device 101 according to the embodiment of the present invention.

It should be noted that the pixel output line 34, the transfer signal line 31, the reset signal line 32 and the selection signal line 33 in FIG. 2, for example, are formed of different wiring layers except the uppermost layer and that the power source potential supply line (power source line) 30 is formed of the wiring layer of the uppermost layer. The reset signal line 32 and the selection signal line 33 are formed of the same wiring layer.

As shown in FIG. 8, in the embodiment of the present invention, wiring lines 106, 107, 108 are connected to respective pixels including photoelectric converting elements 110, 111 and 112 in the imaging area 102 and are shifted based on pupil correction amount. The wiring lines 106, 107, 108 are connected to a wiring line 125 not shifted in the peripheral circuit 103 through a connection expanded portion 130 integrally formed with the wiring line 125. FIG. 8 shows the portion where the pixel array block shown in FIG. 1, that is, the imaging area 2 and the vertical driving circuit 3 are connected.

In this embodiment, connection expanded portions 130 with a predetermined width in the wiring shift direction based on pupil correction amount are provided at the tip end portions of the wiring lines 125 extended from the vertical driving circuits, here, vertical drivers 127, 128 and 129 formed of the MOS transistors 121. More specifically, the connection expanded portion 130 has at least the width corresponding to the maximum shifted width relative to the distance from the center of the imaging area 102. The wiring lines 125 in the vertical drivers 127 to 129 are not shifted but fixed to predetermined positions.

On the other hand, the wiring lines 106 to 108 in the imaging area 102 are formed at positions displaced corresponding to the pupil correction amount that is changed in accordance with the distance from the center of the imaging area 102 to the periphery, and connection ends thereof are connected to the connection expanded portions 130 of the wiring lines 125 in the vertical drivers 127 to 129. The wiring lines 106 to 108 are formed such that the shifted amount is gradually increased from the center to the periphery of the imaging area 102.

Each of the MOS transistors 121 in the vertical drivers 127 to 129 includes a pair of source/drain regions 122, 123 and a gate electrode 124 formed through a gate insulated film, and wiring lines (electrodes) 125 and 126 are formed on the source/drain regions 122 and 123 through a contact area 120. The connection expanded portion 130 is formed on the wiring line 125 of the one source/drain region 122.

The wiring lines 106 to 108 being the signal lines are connected to the connection expanded portion 130 provided to the wiring lines 125 in the vertical drivers 127 to 129, with the positions thereof sequentially displaced. According to a first embodiment of the present invention, the wiring lines 106 to 108 in the imaging area 102, the wiring lines 125 in the vertical drivers 127 to 129 and the connection expanded portions 130 are integrally formed by a first wiring layer.

Figure 9:
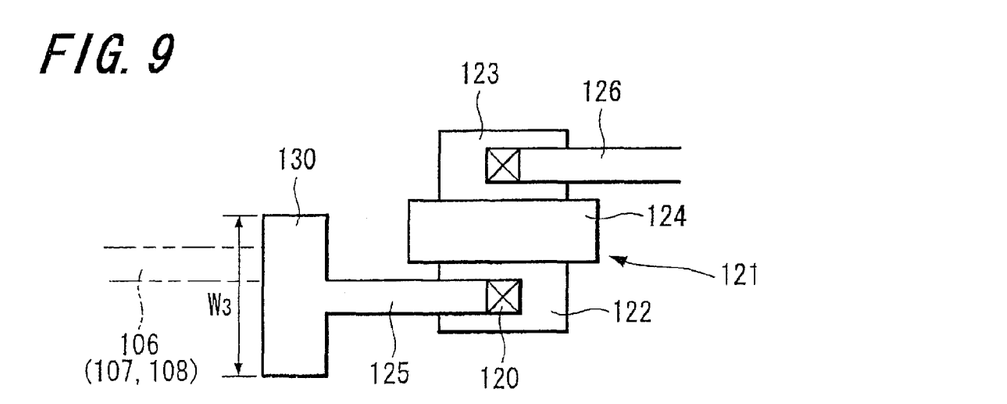
FIG. 9 is a diagram showing an example of a connection expanded portion according to the first embodiment of the present invention.

The pattern shape of the wiring line 125 including the connection expanded portion 130 can be made identical with respect to the wiring lines 125 for all vertical drivers formed corresponding to all pixels in the vertical direction of the imaging area 102. Specifically, one kind of wiring pattern is provided. In this case, as shown in FIG. 9, the pattern is shaped such that the wiring line 125 is extended from the center of the connection expanded portion 130. Therefore, a whole width W3 of the connection expanded portion 130 corresponds to twice the maximum shifted width relative to the distance from the center of the imaging area 102 and is capable of contacting.

In the case of the shape of the pattern shown in FIG. 9, since the wiring lines (106 to 108) being the signal lines are shifted in the opposite directions in the upper and lower areas with the horizontal axis passing the center of the imaging area 102 as a boundary, approximately half the area of the respective connection expanded portion 130 may not be used for connections.

Figure 10A:
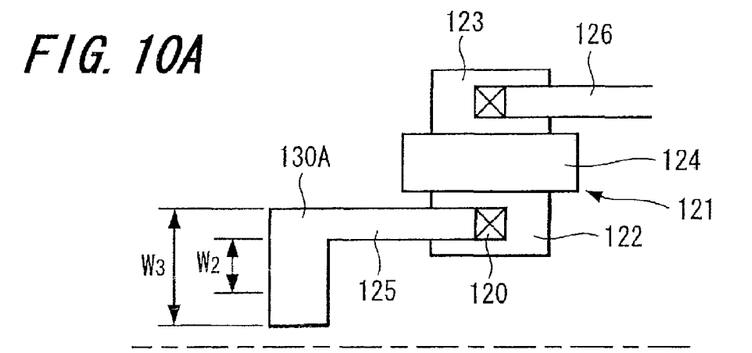
FIGS. 10A and 10B are diagrams showing other examples of connection expanded portions according to the first embodiment of the present invention, respectively.
Figure 10B:
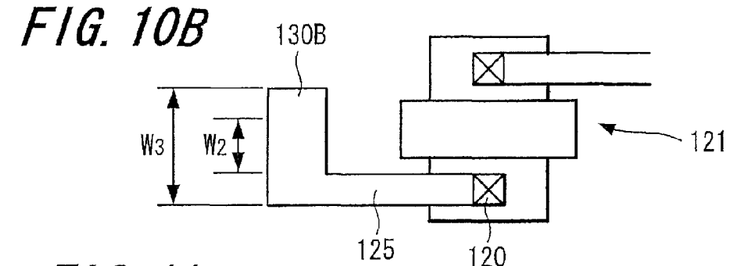

Accordingly, as shown in FIGS. 10A and 10B, the unused portion of the connection expanded portion 130 may be removed and the pattern shape of the wiring line 125 with the connection expanded portion 130 may be formed as described below. Specifically, the connection expanded portions 130 has a symmetrical pattern shape with respect to the upper and lower areas with the horizontal axis passing the center of the imaging area 102 as a boundary, that is, the connection expanded portions 130 [130A, 130B] have the width equivalent to the maximum shifted amount W2 corresponding to the pupil correction amount and have a contact width W3. FIG. 10A shows the wiring pattern for the upper area in the imaging area 102 and FIG. 10B shows the wiring pattern for the lower area in the imaging area 102. More specifically, two kinds of wiring patterns are formed as the wiring pattern in the peripheral circuit 103. It should be noted that the wiring patterns shown in FIGS. 10A and 10B are formed based on the state of the wiring line 63, which is not shifted, of the related art in the imaging area shown in FIG. 6.

The pixel output line 34 (see FIG. 2) shifted, and the wiring line not shifted in the peripheral circuit may be connected through the above-mentioned connection expanded portion 130 provided to the wiring line in the peripheral circuit 103, although not shown. In this case, the pixel output line 34 may be formed of a wiring layer other than the first layer, the wiring line of the peripheral circuit 103 and the connection expanded portion 130 may be formed of the first wiring layer and the connection expanded portion 130 and the pixel output line 34 may be connected through a buried conductive layer.

Also, as mentioned hereinbefore, the power supply line 30 of the uppermost wiring layer is formed such that the opening position corresponding to the photoelectric converting element may be shifted from the center to the periphery based on a pupil correction amount. Similarly, the on-chip micro lens and the color filter are formed such that the shift amount thereof may be increased from the center to the periphery.

Figure 11:
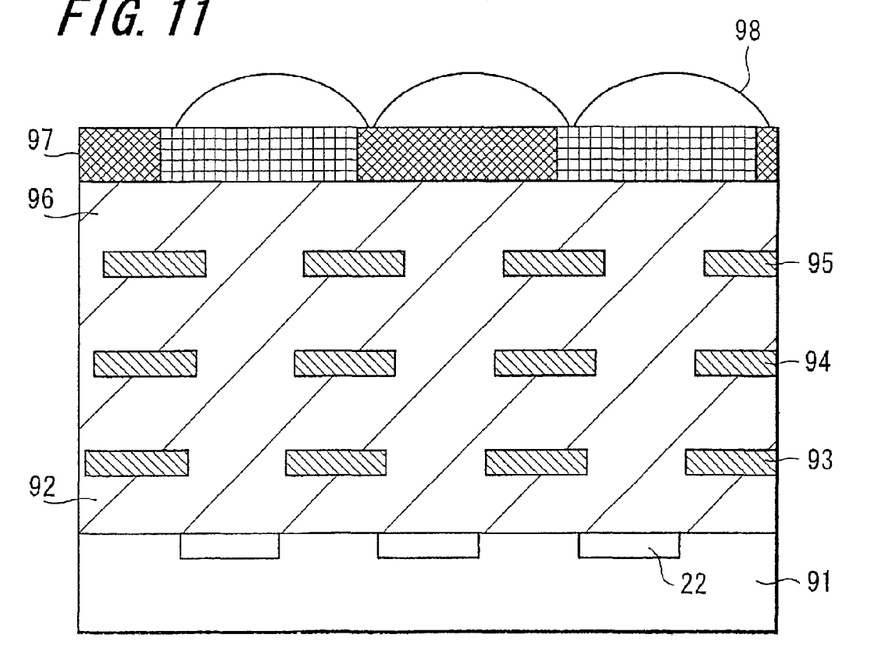
FIG. 11 is a cross-sectional view showing a cross-sectional structure of an imaging area according to the first embodiment of the present invention.

FIG. 11 shows a schematic cross-sectional structure of the imaging area according to the embodiment of the present invention. In the imaging area, a plurality of photoelectric converting elements 22 corresponding to respective pixels are formed on a semiconductor substrate 91. Although only the photoelectric converting element is shown in FIG. 11, a plurality of other MOS transistors described above are formed on respective pixels. As shown in FIG. 11, a plurality of wiring layers, in this example, three wiring layers 93, 94 and 95 are formed above the semiconductor substrate 91 through an insulating interlayer 92. The three wiring layers 93, 94 and 95 are formed such that the center of the openings may be shifted from the center of the photoelectric converting elements 22, that is, shifted from the center of the imaging area to the periphery based on the pupil correction amount. A color filter and an on-chip microlens 98 are formed on an insulating interlayer of the uppermost layer, that is, a planarized film 96. The color filter 97 and the on-chip microlens 98 also are formed such that the center thereof is shifted from the center of the photoelectric converting element 22.

The solid-state imaging device according to the first embodiment may be manufactured as follows. The pixels formed of the photoelectric converting elements and transistors are formed in a two-dimensional array on the semiconductor substrate in a region where the imaging area is formed, and respective circuits are formed in a region where the peripheral circuit is formed. Next, the first wiring layer is formed through the insulating interlayer, and the wiring lines 106 to 108 in the imaging areas, the connection expanded portion 130 and the wiring line 125 in the peripheral circuit connected to each other are formed by one patterning carried out on the first wiring layer. Also, the wiring line in the peripheral circuit connected to the pixel output line, for example, is formed of the first wiring layer so as to include a connection expanded portion. Next, an insulating interlayer is formed and a buried conductive layer connected to the above-described connection expanded portion is formed on the insulating interlayer. Next, a pixel output line connected to the buried conductive layer is formed of the second wiring layer. Subsequently, a power source line is formed of the third wiring layer through the insulating interlayer, and a color filter and an on-chip microlens are formed through a planarized film.

In the solid-state imaging device 101 according to the first embodiment of the present invention, the connection expanded portion 130 with a predetermined width corresponding to at least the maximum shifted width or more based on the pupil correction amount is formed on the wiring line in the peripheral circuit 103, for example, on the wiring line 125 in the vertical driving circuit, and the shifted wiring lines 106 to 108 in the imaging area 102 are connected to the peripheral circuit through the connection expanded portions 130. Accordingly, only the wiring lines 106 to 108 in the imaging area 102 are displaced without shifting the wiring line 125 in the vertical driving circuit. Hence, a solid-state imaging device in which shading is controlled more efficiently can be provided. Also, when a mask for wiring layout is designed, the mask can be designed using such data that wiring pattern data on the wiring line 125 in the peripheral circuit and the connection expanded portion 130 provided at the tip end thereof is constant, and the position of the wiring line connected to the shifted wiring lines 106 to 108 in the imaging area is varied based on the pupil correction amount. Accordingly, the mask can be designed easily as compared to the case according to Japanese Unexamined Patent Application Publication No. 2003-273342 described above, in which data used for each wiring line is varied.

According to the first embodiment, while the connection expanded portion 130 is integrally formed with the wiring line 125, which is not shifted, in the vertical driving circuit serving as the peripheral circuit 103, the connection expanded portions 130 may be integrally formed with the shifted wiring lines 106 to 108 in the imaging area 102.

Figure 12:
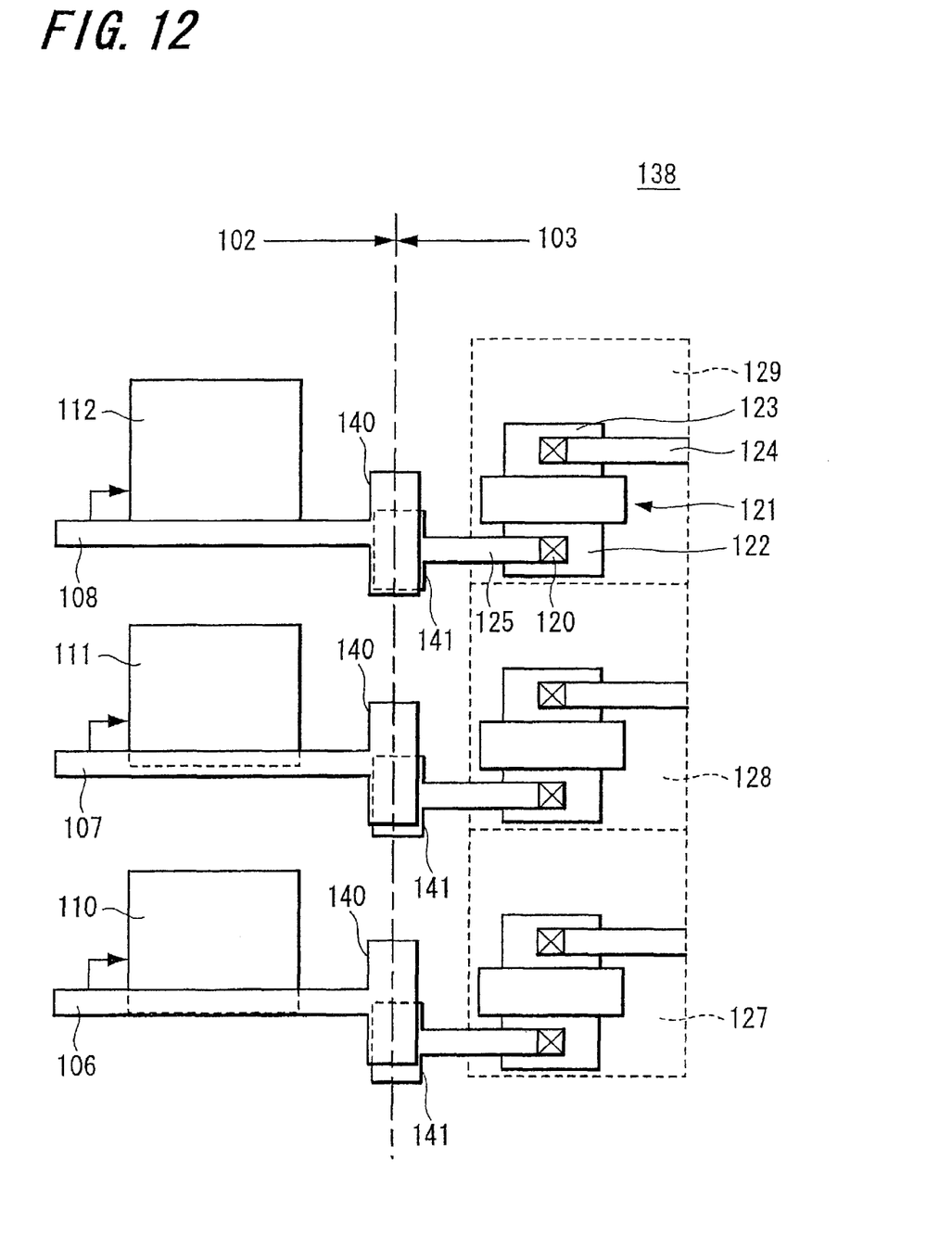
FIG. 12 is a schematic diagram of a main portion showing a solid-state imaging device according to a second embodiment of the present invention.

FIG. 12 is a diagram showing a solid-state imaging device according to a second embodiment of the present invention. A solid-state imaging device 138 includes an imaging area in which a plurality of unit cells, each formed of a photoelectric converting element and a plurality of MOS transistors for reading a signal from the photoelectric converting element are arranged in a two-dimensional array and a peripheral circuit. An arrangement of the unit cell is similar to that described in the first embodiment of the present invention.

Also in the second embodiment of the present invention, the aforementioned CMOS image sensor shown in FIGS. 1 and 2 can be applied similarly to the first embodiment. Relationships between the respective signal lines and the multilayer wiring layers can be selected to be similar to those in the first embodiment of the present invention.

As shown in FIG. 12, according to the second embodiment of the present invention, the wiring lines 106, 107 and 108 being signal lines connected to respective pixels including the photoelectric converting elements 110, 111 and 112 in the imaging area 102 and shifted based on pupil correction amounts, and wiring lines 125 not shifted in the peripheral circuit 103 are connected to each other through connection expanded portions 140 and 141. FIG. 12 shows the portion where the aforementioned pixel array block shown in FIG. 1, that is, the imaging area 2 and the vertical driving circuit 3 forming the peripheral circuit are connected.

In the second embodiment, connection expanded portions 140 with a predetermined width in the wiring shift direction based on pupil correction amount are provided at the tip ends of the respective wiring lines 106 to 108 in the imaging area 102. On the other hand, connection expanded portions 141 with a predetermined width in the wiring shift direction based on pupil correction amount are provided at tip ends of the wiring lines 125 extended from vertical driving circuits, herein, vertical drivers 127, 128 and 129 formed of MOS transistors 121. That is, the connection expanded portions 140 and 141 may have at least the width corresponding to maximum shifted width relative to the distance from the center of the imaging area.

The wiring lines 125 in the vertical drivers 127 to 129 are not shifted but fixed to predetermined positions. The wiring lines 106 to 108 in the imaging area are formed at positions displaced corresponding to the pupil correction amount that is changed in accordance with the distance from the center of the imaging area to the periphery. The wiring lines 106 to 108 are formed such that the shifted amount is gradually increased from the center of the imaging area 102 to the periphery. The connection expanded portions 140 and 141 are formed in the vicinity of the boundary between the imaging area 102 and the peripheral circuit 103.

In the second embodiment, the wiring lines 125 in the vertical drivers 127 to 129 and the connection expanded portions 141 at the tip ends of the wiring lines 125 are integrally formed of a predetermined wiring layer, in this example, a first layer. The wiring lines 106 to 108 serving as the signal lines and the connection expanded portions 140 at the tip ends of the wiring lines 106 to 108 are integrally formed of a wiring layer of a predetermined layer, in this example, a second layer. The corresponding connection expanded portions 140 and 141 are connected through the buried conductive layer formed in the insulating interlayer. Specifically, the connection expanded portions 140 of the wiring lines 106 to 108 serving as the signal lines are connected to the connection expanded portions 141 provided to the wiring lines 125 in the vertical drivers 127 to 129 at positions sequentially shifted based on pupil correction amount.

The arrangement of the MOS transistor 121 in each of the vertical drivers 127 to 129 is similar to that explained in the first embodiment, and therefore is not described in detail.

Figure 13:
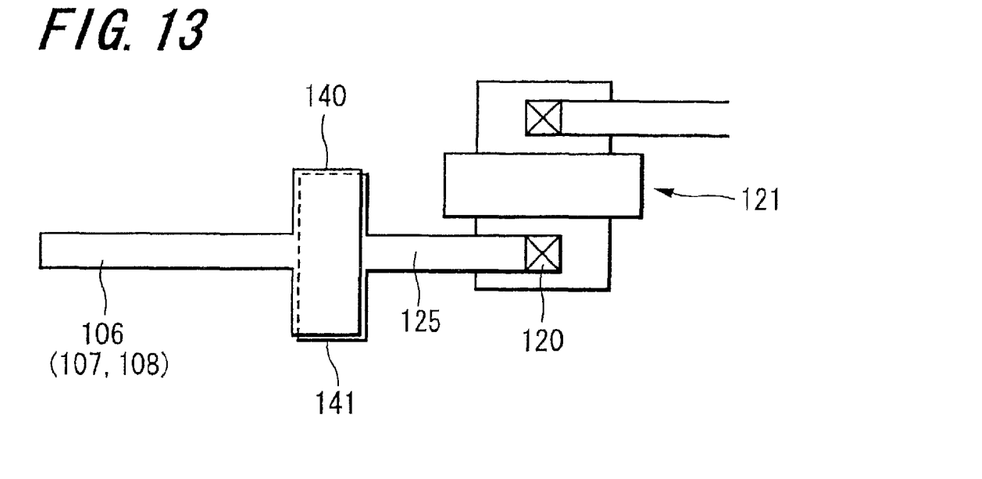
FIG. 13 is a diagram showing an example of a connection expanded portion according to the second embodiment of the present invention.

The pattern shapes of the wiring lines 106 to 108 and 125 including the respective connection expanded portions 140 and 141 formed at the tip ends can be made identical for the wiring lines 125 in all vertical drivers formed corresponding to all pixels in the vertical direction of the imaging area 102 (see FIG. 13). That is, one kind of wiring pattern is provided.

Further, in the case of the pattern shape shown in FIG. 13, since the wiring lines (106 to 108) being the signal lines are shifted in the opposite directions in the upper and lower areas with the horizontal axis passing the center of the imaging area 102 as a boundary, approximately half the area of the respective connection expanded portions 140 and 141 may not be used for connections.

Figure 14A:
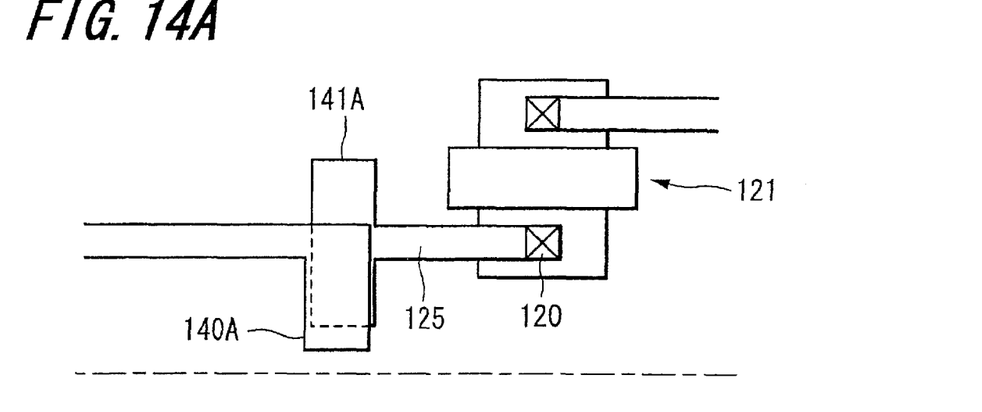
FIGS. 14A and 14B are diagrams showing other examples of connection expanded portions according to the second embodiment of the present invention, respectively.
Figure 14B:
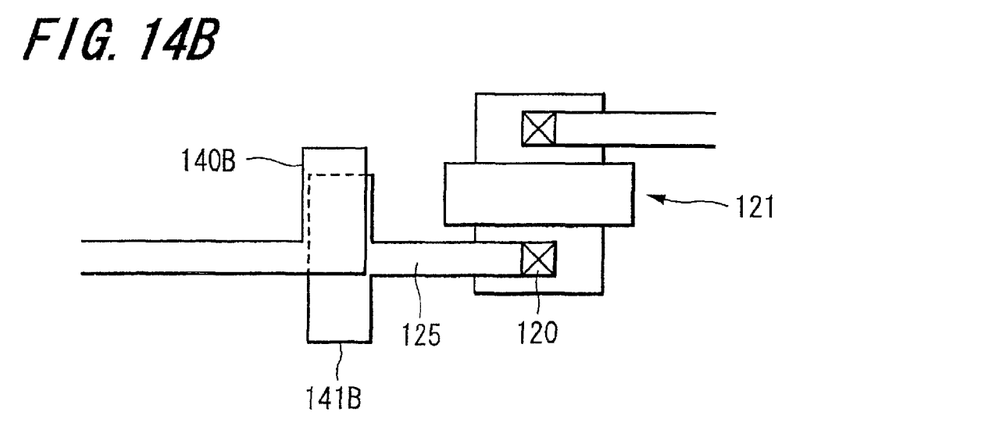

Accordingly, as shown in FIGS. 14A and 14B, the unused portions of the connection expanded portions 140 and 141 may be removed and the pattern shape of the wiring lines 106 to 108 and 125 with the connection expanded portions 140 and 141 may be formed as described below. Specifically, the connection expanded portions 140 have symmetrical shape with respect to the upper and lower areas with the horizontal axis passing the center of the imaging area 102 as a boundary, that is, the connection expanded portions 140 [140A, 140B] and 141[141A, 141B] have the width equivalent to the maximum shift amount W2 corresponding to the pupil correction amount and have the contact width W3. FIG. 14A shows the wiring pattern for the upper area and FIG. 14B shows the wiring pattern for the lower area. More specifically, in this case, two kinds of wiring patterns are formed as the wiring patterns in the imaging area 102 and the wiring patterns in the peripheral circuit 103, respectively. It should be noted that the wiring patterns shown in FIGS. 14A and 14B are formed based on the state of the wiring line 63, which is not shifted, of the related-art in the imaging area shown in FIG. 6.

Further, the connection expanded portion 141 of the wiring line 125 which is not shifted may have a sufficiently wide contact width, and the connection expanded portions 140 alone in the wiring lines 106 to 108 which are shifted may have the arrangements shown in FIG. 13 and FIGS. 14A and 14B. Also, the relationship between the connection expanded portions 140 and 141 can be reversed.

The pixel output lines 34 (see FIG. 2) which are shifted and the wiring lines in the peripheral circuit which are not shifted can be connected using the connection expanded portions similarly provided on the respective wiring lines as described above through the buried conductive layer formed in the insulating interlayer, although not shown in the figures. Alternatively, the pixel output wiring lines 34 and the wiring lines in the peripheral circuit which are connected to the pixel output wiring lines 34 can be formed of the wiring layer of the first layer similarly to the first embodiment. Further, the power supply line formed of the uppermost wiring layer may be formed such that the position of the opening corresponding to the photoelectric converting element is shifted from the center to the periphery based on the pupil correction amount, and the on-chip microlens and the color filter also may be shifted from the center to the periphery. The schematic cross-sectional structure of the imaging area according to the second embodiment can be similar to that shown in FIG. 11.

The solid-state imaging device according to the second embodiment may be manufactured as follows. The pixels formed of the photoelectric converting elements and transistors are formed in a two-dimensional array on the semiconductor substrate in a region where the imaging area is formed, and respective circuits are formed in a region where the peripheral circuit is formed. Next, the wiring lines having the connection expanded portions 141 in the peripheral circuit, for example, in the vertical driving circuit integrally formed may be formed by patterning the first wiring layer through the insulating interlayer. Also, the pixel output line and the wiring lines in the peripheral circuit connected to the pixel output line, for example, are formed of the first wiring layer. Next, the insulating interlayer is formed and the buried conductive layer connected to the connection expanded portion 141 is formed on the insulating interlayer. Next, the second wiring layer is formed and the wiring line having the connection expanded portion 140 integrally formed in the imaging area is formed by patterning the second wiring layer. Here, the wiring line is formed such that the connection expanded portion 140 may be connected to the buried conductive layer. Subsequently, the power supply line may be formed of the third wiring layer through the insulating interlayer, and the color filter and the on-chip microlens are formed through the planarized film.

In the solid-state imaging device 138 according to the second embodiment of the present invention, the connection expanded portions 140 and 141 with a predetermined width corresponding to at least the maximum shifted width or more based on the pupil correction amount are formed on one or both of the wiring lines in the peripheral circuit 103; for example, on the wiring lines 125 in the vertical driving circuit and wiring lines 106 to 108 in the imaging area 102, and both of the connection expanded portions 141 and 140 are connected. Accordingly, only the wiring lines 106 to 108 in the imaging area are displaced without shifting the wiring lines 125 in the vertical driving circuit. Hence, the solid-state imaging device in which shading is controlled more efficiently can be provided. Also, when a mask for wiring layout is designed, the mask can be designed using such data that wiring pattern data on the wiring line 125 and the connection expanded portion 141 provided at the tip end thereof is constant, and the position where the connection expanded portion 140 provided at the tip end of the wiring lines 106 to 108 and the connection expanded portion 141 are connected is varied based on the pupil correction amount. Accordingly, the mask can be designed easily as compared to the case according to Japanese Unexamined Patent Application Publication No. 2003-273342 described above, in which data used for each wiring line is varied.

Figure 15:
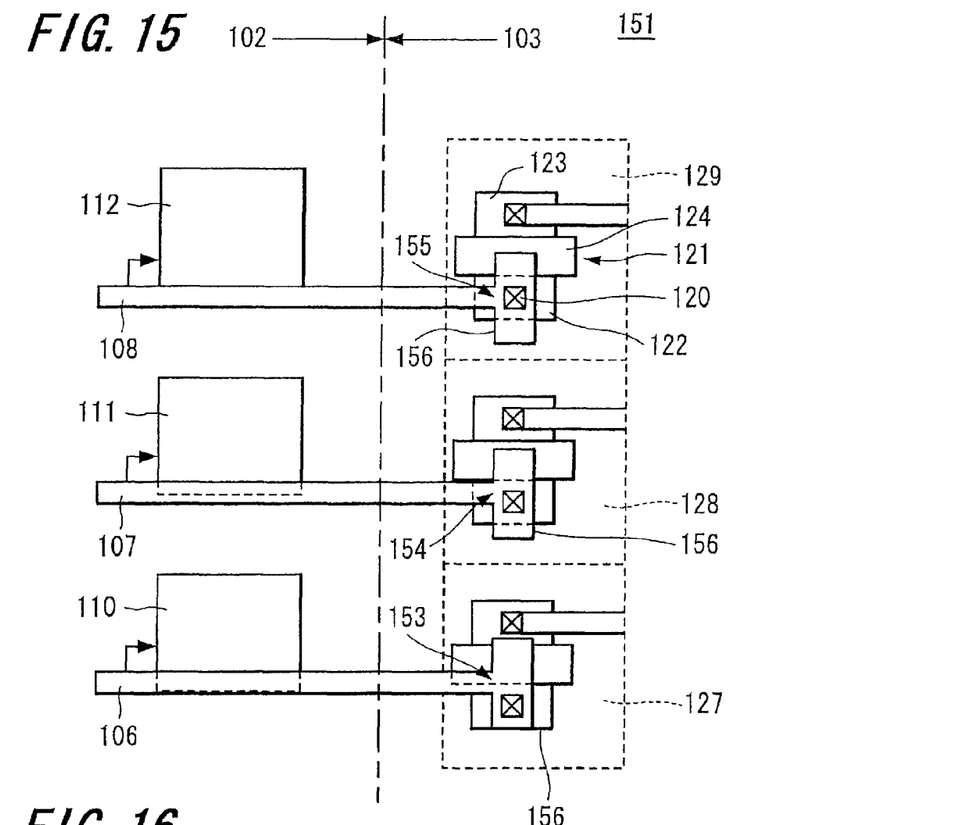
FIG. 15 is a schematic diagram of a main portion showing a solid-state imaging device according to a third embodiment of the present invention.

FIG. 15 is a diagram showing a solid-state imaging device according to a third embodiment of the present invention. A solid-state imaging device 151 according to the third embodiment includes an imaging area in which unit cells formed of a photoelectric converting element and a plurality of MOS transistors for reading signals from the photoelectric converting element are arranged in a two-dimensional array, and a peripheral circuit. An arrangement of the unit cell is similar to that explained in the first embodiment of the present invention.

Also in the third embodiment, similarly to the first embodiment, the aforementioned CMOS image sensor shown in FIGS. 1 and 2 can be applied. A relationship between the respective signal lines and the multilayer wiring layers also can be made similar to that of the first embodiment of the present invention.

As shown in FIG. 15, according to the third embodiment of the present invention, the wiring lines 106 to 108 are connected to the respective pixels including the photoelectric converting elements 110, 111 and 112 in the imaging area 102 and are shifted based on the pupil correction amount. Connection expanded portions 156 are respectively formed on extended end portions 153, 154 and 155 of the wiring lines 106 to 108 extended to the peripheral circuit 103. Further, according to the third embodiment, the extended end portions 153, 154 and 155 are connected through the connection expanded portions 156 to the elements in the peripheral circuit 103, in this example, to the contact areas 120 of the MOS transistors 121 constituting the respective vertical drivers 127 to 129 in the vertical driving circuit. FIG. 15 shows the portion where the aforementioned pixel array block shown in FIG. 1, that is, the imaging area 2 and the vertical driving circuit 3 forming the peripheral circuit are connected.

In the third embodiment, the connection expanded portions 156 with the a predetermined width in the wiring shift direction based on the pupil correction amount are provided at the extended end portions 153 to 155 of the wiring lines 106 to 108 in the imaging area 102. The connection expanded portion 156 may have a predetermined width corresponding to at least the maximum shift width or more based on the pupil correction amount. The connection expanded portion 156 is connected to the contact area 120 of one source/drain region 122 of the MOS transistor 121 forming the vertical drivers 127 to 129. The position of the contact area is fixed.

Since the wiring lines 106 to 108 are displaced based on the pupil correction amount, the connection expanded portions 156 integrally formed with the extended end portions 153 to 155 are connected to the contact area 120 of the source/drain region 122 of the MOS transistor 121 with the positions sequentially shifted. In the third embodiment, the wiring lines 106 to 108 and the connection expanded portions 156 at the extended end portions 153 to 155 are formed of the same wiring layer, for example, the first wiring layer, and the connection expanded portions 156 and the contact area 120 of the source/drain region 122 are connected through the buried conductive layer formed in the insulating interlayer.

The pattern shape of the connection expanded portion 156 can be formed identical with respect to the wiring lines 125 for all vertical drivers formed corresponding to all pixels in the vertical direction of the imaging area 102. Specifically, one kind of wiring pattern is provided. The arrangement of the connection expanded portion 156 is similar to that explained in the first embodiment of the present invention.

Also, since the wiring lines (106 to 108) which become the signal lines are shifted in the opposite directions in the upper and lower areas with the horizontal axis passing the center of the imaging area 102 as a boundary, the pattern shape of the connection expanded portion 156 can be symmetrical with respect to the upper and lower areas. Specifically, the connection expanded portion 156 has the pattern shape having the width equivalent to the maximum shifted amount corresponding to the pupil correction amount and having the width capable of contacting.

Although not shown, the pixel output lines (wiring lines) which are shifted and the contact area of the element in the peripheral circuit in which wiring lines are not shifted can be connected similarly as described above. Further, the power supply lines formed of the uppermost wiring layer are formed such that the opening positions corresponding to the photoelectric converting elements are shifted from the center to the periphery based on the pupil correction amount. Similarly, the on-chip microlens and the color filter also are shifted from the center to the periphery. A schematic cross-sectional structure of the imaging area according to the third embodiment of the present invention can be similar to that shown in FIG. 9.

In the solid-state imaging device 151 according to the third embodiment of the present invention, the connection expanded portions 156 with the predetermined width based on the pupil correction amount are provided to the extended end portions 153 to 155 of the wiring lines 106 to 108 in the imaging area 102. The connection expanded portions 156 and the contact area of the element in the peripheral circuit, in this example, the contact area 120 of the source/drain region 122 in the MOS transistor 121 forming the vertical driving circuit are connected together. Accordingly, only the wiring lines 106 to 108 in the imaging area 102 are displaced without shifting the contact area 120 of the vertical driving circuit. Hence, the solid-state imaging device in which shading is controlled more efficiently can be provided. Also, when a mask for wiring layout is designed, the mask can be designed using such data that pattern data on the connection expanded portion 156 is constant, and that the position where the connection expanded portion 156 and the wiring lines 106 to 108 are connected is varied based on the pupil correction amount. Accordingly, the mask can be designed easily as compared to the case according to Japanese Unexamined Patent Application Publication No. 2003-273342 described above, in which data used for each wiring line is varied.

Figure 16:
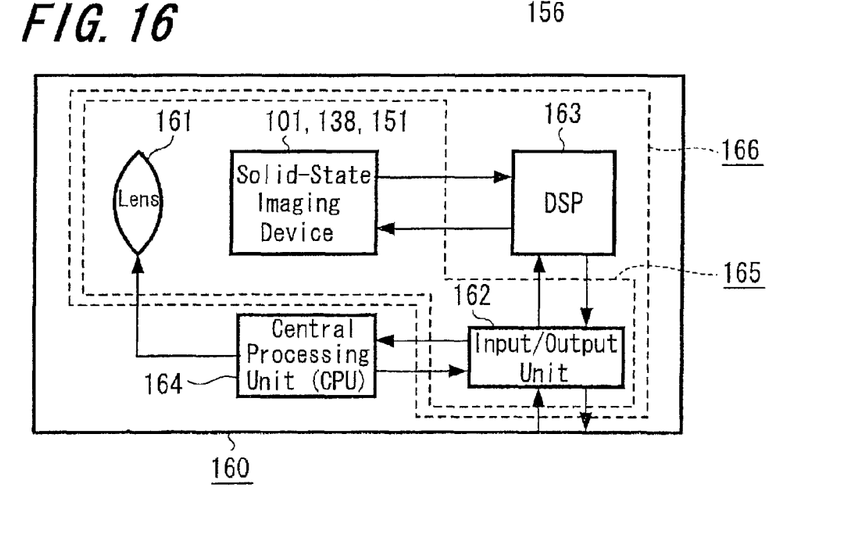
FIG. 16 is a schematic diagram showing a module according to the embodiments of the present invention.

The solid-state imaging devices according to the embodiments of the present invention can be applied to an electronic device module and a camera module. FIG. 16 shows a schematic configuration of the electronic device module and the camera module. The module shown in FIG. 16 can be applied as the electronic device module and the camera module. A module 160 may incorporate therein any of solid-state imaging devices according to the above-mentioned embodiments; that is, the CMOS image sensors 101, 138 or 151, an optical lens system 161, an input/output unit 162, a signal processing unit (digital signal processor) 163 and a central processing unit (CPU) 164 for controlling an optical lens system are incorporated. Also, the electronic device module or the camera module 165 can be formed only with the CMOS image sensors 101, 138 or 151, the optical lens system 161 and the input/output unit 162. Also, the module may include the CMOS image sensors 101, 138 or 151, the optical lens system 161, the input/output unit 162 and the signal processing apparatus 163.

According to the electronic device module and the camera module, shading in the CMOS image sensor can be controlled more efficiently and an image quality can be improved.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
an imaging area that includes
arrayed pixels having photoelectric converting units and transistor elements, and
first wiring lines, which extend in a wiring direction, are connected to corresponding ones of the transistor elements, and are disposed in the imaging area; and
a peripheral circuit including second wiring lines that extend in the wiring direction and are disposed in a predetermined wiring pattern,
wherein each of the first wiring lines has a connection expanded portion integrally formed therewith, each connection expanded portion having a longitudinal axis extending in a direction transverse to the wiring direction,
wherein each of the first wirings is connected through its connection expanded portion to a corresponding one of the second wirings, and
wherein at least some of the first wirings are shifted away from their respectively corresponding second wirings in the direction transverse to the wiring direction by respective shift amounts that are each based on a pupil correction amount.

2. The solid-state imaging device of claim 1, wherein the connection expanded portions of the first wiring lines have substantially identical lengths along their longitudinal axis.

3. The solid-state imaging device of claim 2, wherein the magnitude of the length of each connection expanded portion along their longitudinal axis is equal to or greater than a value corresponding to a maximum shift amount of the first wiring lines.

4. The solid-state imaging device of claim 1,
wherein each of the second wiring lines has a second connection expanded portion integrally formed therewith, each second connection expanded portion having a longitudinal axis extending in the direction transverse to the longitudinal wiring direction, and
wherein each of the first wiring lines is connected to its corresponding second wiring line through the second connection expanded portion of the corresponding second wiring line as well as through the connection expanded portion of the respective first wiring line.

5. The solid-state imaging device of claim 1,
wherein the connection expanded portion of each of the first wiring lines is located at a boundary between the imaging area and the peripheral circuit.

6. The solid-state imaging device of claim 1,
wherein the first wiring lines and the second wiring lines are formed of wiring layers different from each other.

7. The solid-state imaging device of claim 1,
wherein the peripheral circuit is configured to selectively provide signals to the first wiring lines.

8. The solid-state imaging device of claim 1,
wherein the peripheral circuit is configured to receive and selectively process signals from the first wiring lines.

9. A solid-state imaging device comprising:
an imaging area that includes
arrayed pixels having photoelectric converting units and transistor elements, and
first wiring lines, which extend in a wiring direction, are connected to corresponding ones of the transistor elements, and are disposed in the imaging area; and
a peripheral circuit including second wiring lines that extend in the wiring direction and are disposed in a predetermined wiring pattern, wherein each of the second wiring lines has a connection expanded portion integrally formed therewith, each of the connection expanded portions having a longitudinal axis extending in a direction transverse to the wiring direction, wherein each of the second wirings is connected through its connection expanded portion to a corresponding one of the first wirings, and wherein at least some of the first wirings are shifted away from their respectively corresponding second wirings in the direction transverse to the wiring direction by respective shift amounts that are each based on a pupil correction amount.

10. A solid-state imaging device comprising:

an imaging area that includes
- arrayed pixels having photoelectric converting units and transistor elements, and
- first wiring lines, which extend in a wiring direction, are connected to corresponding ones of the transistor elements, and are disposed in the imaging area; and a peripheral circuit including a plurality of first elements respectively corresponding to the first wiring lines, wherein each of the first elements has an output contact and the output contacts of the first elements are disposed at predetermined locations, wherein each of the first wiring lines has a connection expanded portion integrally formed therewith, each of the connection expanded portions having a longitudinal axis extending in a direction transverse to the wiring direction, wherein each of the first wirings is connected through its connection expanded portion to its corresponding output contact, and wherein at least some of the first wirings are shifted away from their respectively corresponding output contact in the direction transverse to the wiring direction by respective shift amounts that are each based on a pupil correction amount.

11. A method of manufacturing a solid-state imaging device comprising:

forming an imaging area that includes arrayed pixels having photoelectric converting units and transistor elements;

forming a peripheral circuit;

forming first wiring lines, which extend in a wiring direction, are connected to corresponding ones of the transistor elements, and are disposed in the imaging area;

forming second wiring lines that extend in the wiring direction and are disposed in the peripheral circuit in a predetermined wiring pattern; and connecting each of the first wiring lines to a corresponding one of the second wiring lines through connection expanded portions integrally formed with at least one of the first and second wiring lines, each connection expanded portion having a longitudinal axis extending in a direction transverse to the wiring direction, wherein at least some of the first wirings are shifted away from their respectively corresponding second wirings in the direction transverse to the wiring direction by respective shift amounts that are each based on a pupil correction amount.

12. The method of claim 11, further comprising forming the first wiring lines and the second wiring lines in different wiring layers.

* * * * *